US012712026B2

(12) United States Patent
Kim

(10) Patent No.: US 12,712,026 B2
(45) Date of Patent: Aug. 18, 2026

(54) MEMORY DEVICE AND METHOD OF OPERATING THE SAME

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 141 days.

(21) Appl. No.: 18/776,549

(22) Filed: Jul. 18, 2024

(65) Prior Publication Data

US 2025/0292838 A1 Sep. 18, 2025

(30) Foreign Application Priority Data

Mar. 14, 2024 (KR) ........................ 10-2024-0035646

(51) Int. Cl.

*G11C 16/04* (2006.01)
*G11C 16/12* (2006.01)
*G11C 16/16* (2006.01)
*G11C 16/24* (2006.01)
*G11C 16/32* (2006.01)

(52) U.S. Cl.

CPC .......... *G11C 16/16* (2013.01); *G11C 16/0483* (2013.01); *G11C 16/12* (2013.01); *G11C 16/24* (2013.01); *G11C 16/32* (2013.01)

(58) Field of Classification Search

CPC ..... G11C 16/0483; G11C 16/12; G11C 16/16; G11C 16/24; G11C 16/32
USPC .................................................... 365/185.29
See application file for complete search history.

(56) References Cited

U.S. PATENT DOCUMENTS

| | | | | |
|---|---|---|---|---|
| 2014/0064002 | A1 * | 3/2014 | Kwon | G11C 16/24 365/203 |
| 2021/0065809 | A1 * | 3/2021 | Hwang | G11C 11/5635 |
| 2021/0217480 | A1 * | 7/2021 | Oh | G11C 16/24 |
| 2023/0420056 | A1 * | 12/2023 | Lee | G11C 16/16 |
| 2024/0379167 | A1 * | 11/2024 | Seo | G11C 16/0483 |
| 2025/0095747 | A1 * | 3/2025 | Jeon | G11C 16/24 |

FOREIGN PATENT DOCUMENTS

| | | | |
|---|---|---|---|
| KR | 102157863 | B1 | 9/2020 |
| KR | 102388068 | B1 | 4/2022 |
| KR | 1020230059673 | A | 5/2023 |

* cited by examiner

*Primary Examiner* — Ly D Pham
(74) *Attorney, Agent, or Firm* — WILLIAM PARK AND ASSOCIATES LTD.

(57) ABSTRACT

Provided is a memory device and a method of operating the same. The memory device includes a memory block including a plurality of memory cells, a source line driver configured to apply an erase voltage to a source line of the memory block during an erase operation, a page buffer group configured to apply the erase voltage to bit lines of the memory block during the erase operation, a voltage generating circuit configured to generate a select line voltage that is applied to a select line of the memory block during the erase operation, and control logic configured to control the source line driver, the page buffer group, and the voltage generating circuit to perform a suspend operation including suspending the erase operation in response to a suspend command.

11 Claims, 10 Drawing Sheets

FIG. 1

MEMORY DEVICE AND METHOD OF OPERATING THE SAME

CROSS-REFERENCE TO RELATED APPLICATION

The present application claims priority under 35 U.S.C. § 119 (a) to Korean patent application number 10-2024-0035646 filed on Mar. 14, 2024, in the Korean Intellectual Property Office, the entire contents of which application is incorporated herein by reference.

BACKGROUND

1. Technical Field

Various embodiments of the present disclosure relate to an electronic device, including but not limited to a memory device and a method of operating the memory device.

2. Related Art

Of semiconductor devices, memory devices are broadly classified as volatile memory devices and nonvolatile memory devices.

The nonvolatile memory device has relatively low write and read speeds, but retains data stored even when the device's power supply is interrupted. Therefore, the non-volatile memory device is used to store data to be retained regardless of whether power is supplied. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and so forth. The flash memory is classified into a NOR type and a NAND type.

Flash memory has the advantage of RAM in which data is freely programmable and erasable and the advantage of ROM in which stored data can be preserved even when the memory's power supply is interrupted. Such a flash memory is widely used as the storage medium of portable electronic devices such as a digital camera, a personal digital assistant (PDA), and an MP3 player.

SUMMARY

An embodiment of the present disclosure may provide for a memory device. The memory device may include a memory block including a plurality of memory cells, a source line driver configured to apply an erase voltage to a source line of the memory block during an erase operation, a page buffer group configured to apply the erase voltage to bit lines of the memory block during the erase operation, a voltage generating circuit configured to generate a select line voltage that is applied to a select line of the memory block during the erase operation, and control logic configured to control the source line driver, the page buffer group, and the voltage generating circuit to perform a suspend operation including suspending the erase operation in response to a suspend command, wherein the control logic is configured to control the voltage generating circuit such that, during a rising period of the erase operation in which the erase voltage increases to a target voltage level, a difference between the erase voltage and the select line voltage is maintained at a first voltage differential, and during a pulse application period during which the erase voltage at the target voltage level is applied, the difference between the erase voltage and the select line voltage is maintained at a second voltage differential that is greater than the first voltage differential.

An embodiment of the present disclosure may provide for a memory device. The memory device may include a memory block including a plurality of memory cells, a peripheral circuit configured to apply an erase voltage to a source line or a bit line of the memory block during an erase operation and apply a select line voltage to select lines of the memory block, and control logic configured to control the peripheral circuit to perform a suspend operation including suspending the erase operation in response to receiving a suspend command and to perform a resume operation including resuming the suspended erase operation in response to receiving a resume command, wherein the control logic is configured to, when the suspend command is received during a pulse application period of the erase operation during which the erase voltage is applied at a target voltage level, reset the select line voltage used during a resumed pulse application period for the resumed erase operation by decreasing the select line voltage during the resume operation.

An embodiment of the present disclosure may provide for a method of operating a memory device. The method may include applying, to a source line or a bit line of a memory block, an erase voltage that increases to a target voltage level during a rising period of an erase operation, applying, to a select line of the memory block, a select line voltage that is lower than the erase voltage by a first voltage differential during the rising period, in response to receiving a suspend command during the rising period, suspending the erase operation and resuming the erase operation in response to receiving a resume command, after the rising period ends, applying the erase voltage at the target voltage level f during a pulse application period of the erase operation, and applying the select line voltage that is lower than the erase voltage by a second voltage differential during the pulse application period, wherein the second voltage differential is greater than the first voltage differential.

An embodiment of the present disclosure may provide for a method of operating a memory device. The method may include applying, to a source line or a bit line of a memory block, an erase voltage that increases to a target voltage level during a rising period of an erase operation, applying, to a select line of the memory block, a select line voltage that is lower than the erase voltage by a first voltage differential during the rising period, after the rising period ends, applying the erase voltage at the target voltage level during a pulse application period of the erase operation, and in response to receiving a suspend command during the pulse application period, suspending the erase operation and resuming the erase operation in response to receiving a resume command, wherein the resumed erase operation includes applying the select line voltage during a second rising period and applying the erase voltage at the target voltage level during a resumed pulse application period, and the select line voltage during the resumed pulse application period is lower than the select line voltage used during a previous pulse application period by voltage differential.

An embodiment of the present disclosure includes a method that may include, during a first rising period of an erase operation, applying, to a memory block, an erase voltage that increases and applying, to a select line of the memory block, a select line voltage that is lower than the erase voltage by a first voltage differential; during a pulse application period of the erase operation, applying the erase voltage at a constant voltage level and suspending the erase operation in response to receiving a suspend command; and in response to receiving a resume command, resuming the erase operation by applying the select line voltage during a second rising period and applying the erase voltage at the constant voltage level during a resumed pulse application period; wherein the select line voltage during the resumed pulse application period is lower than the select line voltage used during a previous pulse application period by a voltage differential.

BRIEF DESCRIPTION OF THE DRAWINGS

FIG. 1 is a diagram illustrating a memory system according to an embodiment of the present disclosure.

DETAILED DESCRIPTION

Figure 2:
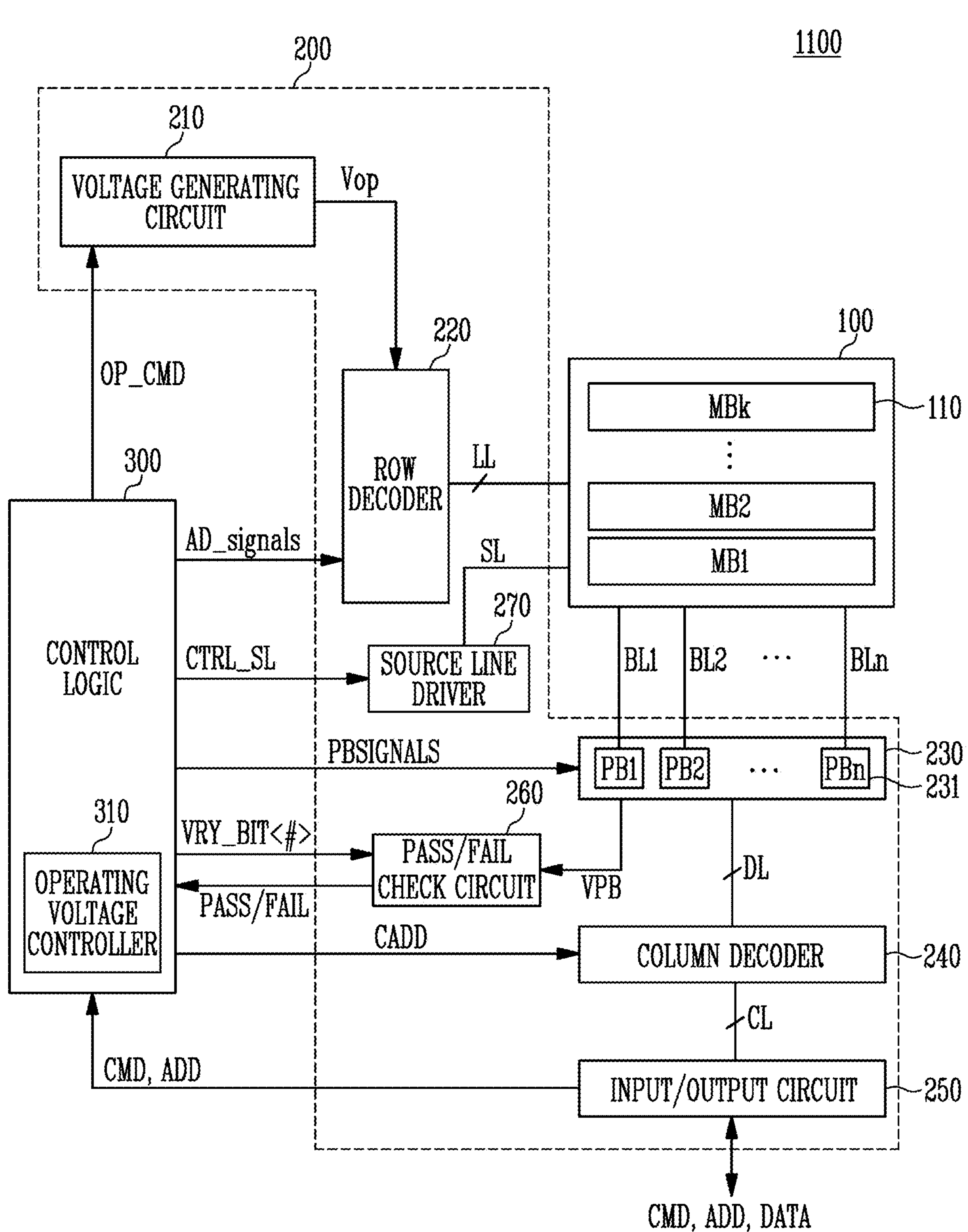
FIG. 2 is a diagram illustrating a memory device according to an embodiment of the present disclosure.

Specific structural or functional descriptions in the embodiments of the present disclosure introduced in this specification or application are provided as examples to describe embodiments according to the concepts of the present disclosure. The embodiments according to the concepts of the present disclosure may be practiced in various forms, and should not be construed as limited to the embodiments described in the specification or application.

Nonvolatile memory devices perform an erase operation including erasing stored data, and the erase operation may require a relatively long time to complete compared to other general operations, for example, a program operation or a read operation. When a command corresponding to a program operation or a read operation is received during an erase operation, the program operation or read operation is performed after the erase operation is temporarily suspended, and the suspended erase operation is resumed after the program operation or the read operation is completed.

Various embodiments of the present disclosure are directed to a memory device that is capable of suppressing changes in threshold voltages of select transistors occurring due to a suspend operation during an erase operation of the memory device, and a method of operating the memory device.

The present disclosure is described in detail by describing one or more embodiments of the present disclosure with reference to the accompanying drawings. One or more embodiments of the present disclosure are described in detail with reference to the drawings. Terms such as "vertical," "horizontal," "on," "lower," "higher," "column," "row," "level," and other terms implying relative spatial relationship or orientation are utilized only for the purpose of ease of description or reference to a drawing and are not otherwise limiting.

Figure 1:
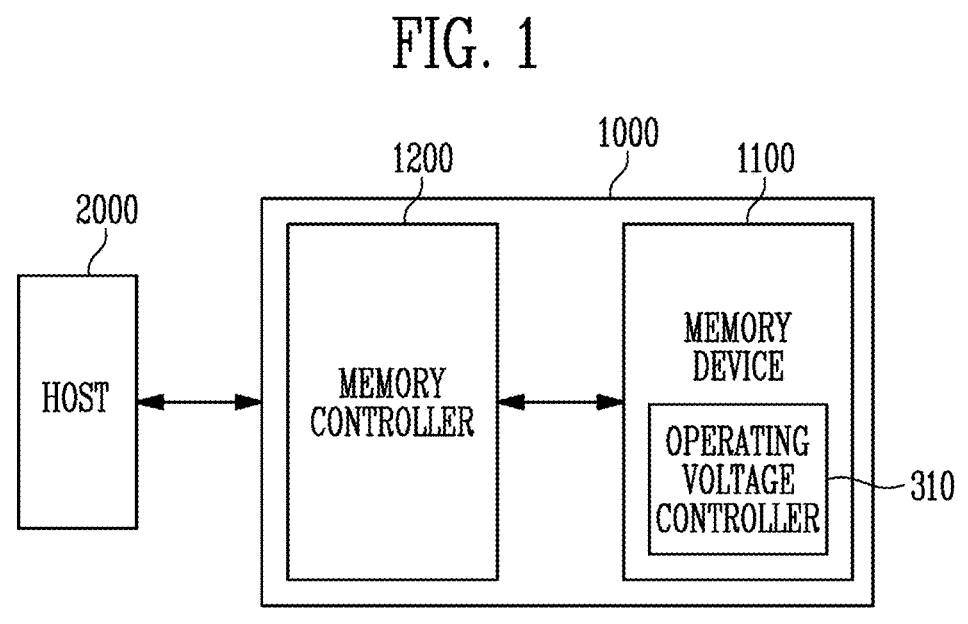

FIG. 1 is a diagram illustrating a memory system according to an embodiment of the present disclosure.

Referring to FIG. 1, under the control of a host 2000, a memory system 1000 includes a memory device 1100 that stores data and a memory controller 1200 that controls the memory device 1100.

The host 2000 is capable of communicating with the memory system 1000 using an interface protocol, such as peripheral component interconnect-express (PCI-E), advanced technology attachment (ATA), serial ATA (SATA), parallel ATA (PATA) or serial attached SCSI (SAS). In addition, the interface protocol between the host 2000 and the memory system 1000 is not limited to the above-described examples, and may be one of various other interface protocols, such as universal serial bus (USB), multimedia card (MMC), enhanced small disk interface (ESDI), and integrated drive electronics (IDE).

The memory controller 1200 controls the overall operation of the memory system 1000 and controls data exchange between the host 2000 and the memory device 1100. For example, the memory controller 1200 programs, reads, or erases data by controlling the memory device 1100 in response to a request received from the host 2000. For example, the memory device 1100 may include a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus DRAM (RDRAM) or a flash memory.

The memory device 1100 performs a program operation, a read operation, and an erase operation under the control of the memory controller 1200.

The memory device 1100 receives a command corresponding to the program operation or a command corresponding to the read operation from the memory controller 1200 during the erase operation. When a suspend command for suspending the erase operation, the command corresponding to the program operation, or the command corresponding to the read operation is received during the erase operation, the memory device 1100 suspends the erase operation currently being performed in response to the suspend command and performs the program operation or read operation corresponding to the command corresponding to the program operation or the read operation. After the program operation or read operation are completed, the memory device 1100 re-performs the erase operation in response to receiving a resume command from the memory controller 1200. Re-performing the erase operation includes performing the erase again from the beginning of the erase operation, such as the beginning of the rising period of the erase operation, or continuing to perform the erase operation from the point where the erase operation was suspended.

The erase operation includes a rising period during which an erase voltage, that is applied to a source line or a bit line of a selected memory block, increases up to a target voltage level and a pulse application period during which the erase voltage is applied at the target voltage level for a predetermined time period after the end of the rising period.

When the suspend command is received during the rising period, the memory device 1100 restarts the rising period when re-performing the suspended erase operation in response to receiving the resume command. When the suspend command is received during the pulse application period, the memory device 1100 checks, determines, or identifies a time period of the pulse application period not yet executed, or determines or identifies the time at which the erase operation was suspended within the pulse application period, and executes the resumed erase operation for the time period corresponding to the unexecuted pulse application period when re-performing the suspended erase operation in response to receiving the resume command, thus continues the erase operation from the time at which the erase operation was interrupted or suspended during the pulse application period.

The memory device 1100 includes an operating voltage controller 310. The operating voltage controller 310 controls the level of an operating voltage that is applied to select lines coupled to transistors for the selected memory block during the erase operation. For example, the operating voltage controller 310 sets the operating voltage such that, during the rising period of the erase operation, the operating voltage applied to the select lines is a voltage lower than the erase voltage by a first voltage, and during the pulse application period, the operating voltage applied to the select lines is a voltage lower than the erase voltage by at least a second voltage. The second voltage is a voltage higher than the first voltage.

Accordingly, a voltage difference between the erase voltage and the operating voltage to be applied to select lines is the first voltage differential that is relatively low when a suspend command is received during the rising period, and the rising period may be repeatedly executed times during the erase operation, thus suppressing a decrease in the threshold voltages of the select transistors.

FIG. 2 is a diagram illustrating a memory device, for example, as shown in FIG. 1.

Referring to FIG. 2, the memory device 1100 includes a memory cell array 100 in which data is stored. The memory device 1100 includes peripheral circuits 200 configured to perform a program operation that stores data in the memory cell array 100, a read operation that outputs the stored data, and an erase operation that erases the stored data. The memory device 1100 include control logic 300 that controls the peripheral circuits 200 under the control of a memory controller, for example, memory controller 1200 of FIG. 1.

The memory cell array 100 includes a plurality of memory blocks MB1 to MBk 110, where k is a positive integer. Local lines LL and bit lines BL1 to BLn, where n is a positive integer, are coupled to each of the memory blocks MB1 to MBk 110. For example, the local lines LL include a first select line, a second select line, and a plurality of word lines arranged between the first select line and the second select line. The local lines LL may include dummy lines, which may be arranged between the first select line and the word lines and between the second select line and the word lines. For example, the first select line may be a source select line, and the second select line may be a drain select line. For example, the local lines LL include the word lines, the drain select line and the source select line, and source lines SL. For example, the local lines LL may include pipelines. The local lines LL are coupled to each of the memory blocks MB1 to MBk 110, and the bit lines BL1 to BLn are coupled in common to the memory blocks MB1 to MBk 110. The memory blocks MB1 to MBk 110 may each be implemented in a two-dimensional (2D) structure or three-dimensional (3D) structure. For example, memory cells in the memory blocks 110 having a 2D structure may be horizontally arranged on a substrate. For example, memory cells in the memory blocks 110 having a 3D structure are vertically stacked on the substrate.

The peripheral circuits 200 may perform program, read, and erase operations on a selected memory block 110 under the control of the control logic 300. For example, the peripheral circuits 200 include a voltage generating circuit 210, a row decoder 220, a page buffer group 230, a column decoder 240, an input/output circuit 250, a pass/fail check circuit 260, and a source line driver 270.

The voltage generating circuit 210 generates, in response to an operation signal OP_CMD, various operating voltages Vop that are used for program operations, read operations, and erase operations. For example, the voltage generating circuit 210 generates various voltages, such as a program voltage, verify voltages, pass voltages, a turn-on voltage, a read voltage, a select line voltage, and so forth under the control of the control logic 300.

The voltage generating circuit 210 generates the select line voltage by adjusting the voltage potential of the select line voltage that is applied to the select lines under control of the operating voltage controller 310 of the control logic 300.

The row decoder 220 transfers or applies the operating voltages Vop to the local lines LL coupled to the selected memory block 110 in response to receiving row decoder control signals AD_signals. The row decoder 220 may be included in the voltage generating circuit 210.

The page buffer group 230 includes a plurality of page buffers PB1 to PBn 231 coupled to the bit lines BL1 to BLn, respectively. The page buffers PB1 to PBn 231 are operated in response to page buffer control signals PBSIGNALS. For example, the page buffers PB1 to PBn 231 temporarily store data received through the bit lines BL1 to BLn or sense voltages or currents of the bit lines BL1 to BLn during a read or verify operation. The page buffers PB1 to PBn 231 apply the erase voltage to the bit lines BL1 to BLn during the erase operation.

The column decoder 240 transfers data between the input/output circuit 250 and the page buffer group 230 in response to receiving a column address CADD. For example, the column decoder 240 exchanges data with the page buffers 231 through data lines DL or exchanges data with the input/output circuit 250 through column lines CL.

The input/output circuit 250 transmits a command CMD and an address ADD, received from the memory controller, for example, 1200 of FIG. 1, to the control logic 300 or exchanges data DATA with the column decoder 240.

During a read operation or a verify operation, the pass/fail check circuit 260 generates a reference current in response to receiving an enable bit VRY_BIT<#>, compares a sensing voltage VPB received from the page buffer group 230 with a reference voltage generated using the reference current and outputs a pass signal PASS or a fail signal FAIL as a result of the comparison.

The source line driver 270 is coupled to memory cells included in the memory cell array 100 through the source line SL and controls a voltage applied to the source line SL. For example, the source line driver 270 electrically connects the source line to a ground node during the program operation, the read operation, and the verify operation. The source line driver 270 applies the erase voltage to the source line SL during the erase operation. The source line driver 270 receives a source line control signal CTRL_SL from the control logic 300 and connects the ground node to the source line or applies the erase voltage to the source line in response to the source line control signal CTRL_SL.

The control logic 300 controls the peripheral circuits 200 by outputting the operation signal OP_CMD, the row decoder control signals AD_signals, the page buffer control signals PBSIGNALS, and the enable bit VRY_BIT<#> in response to receiving the command CMD and the address ADD. The control logic 300 determines whether the verify operation passed or failed in response to the pass or fail signal PASS/FAIL.

When a suspend command is received from the memory controller 1200 of FIG. 1 during the erase operation of the memory device 1100, the control logic 300 performs a suspend operation including suspending the erase operation currently being performed and performs a resume operation including resuming the suspended erase operation in response to receiving a resume command from the memory controller 1200 of FIG. 1.

The control logic 300 includes the operating voltage controller 310. The operating voltage controller 310 control the voltage potential level of an operating voltage that is applied to select lines coupled to the transistors of the selected memory block during the erase operation. The operating voltage controller 310 controls the voltage generating circuit 210 to generate an operating voltage having a predetermined or established voltage potential.

For example, the operating voltage controller 310 selects the operating voltage such that, during the rising period of the erase operation, the operating voltage applied to the select lines is at a voltage lower the erase voltage by a first voltage, and during the pulse application period, the operating voltage applied to the select lines is at a voltage lower the erase voltage by at least a second voltage. The first voltage is a voltage lower than the second voltage.

The operating voltage controller 310 sets the voltage potential of the operating voltage that is applied to the select lines based on the number or quantity of times the suspend operation is performed during the pulse application period of the erase operation. For example, the operating voltage controller 310 decreases the potential level of the operating voltage applied to the select lines based on the number of times the suspend operation is performed during the pulse application period. For example, when a suspend operation is performed during the pulse application period, the operating voltage controller 310 controls the voltage generating circuit 210 to reset the operating voltage of the select lines, applied during the suspended pulse application period, by decreasing the operating voltage by a third voltage differential and to resume the pulse application period using the reset operating voltage of the select lines when a resume operation is performed after the suspend operation.

Figure 3:
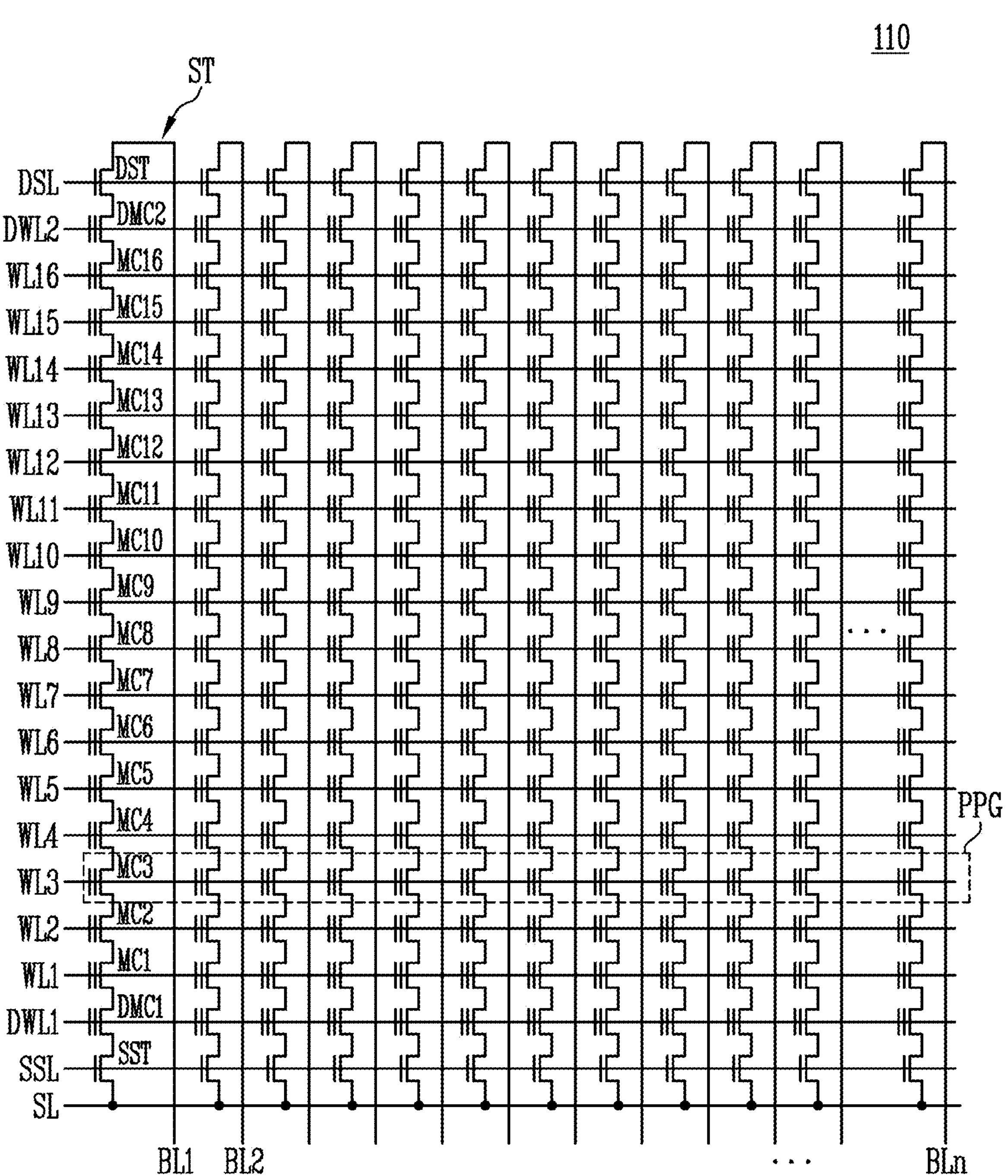
FIG. 3 is a diagram illustrating a memory block according to an embodiment of the present disclosure.

FIG. 3 is a diagram illustrating a memory block, for example, as shown in FIG. 2.

Referring to FIG. 3, a plurality of word lines arranged in parallel between a first select line and a second select line are coupled to the memory block 110. In this example, the first select line is a source select line SSL, and the second select line is a drain select line DSL. The memory block 110 includes a plurality of strings ST coupled between bit lines the BL1 to BLn and a source line SL. The bit lines BL1 to BLn are each coupled to the strings ST, and the strings ST are coupled in common to the source line SL. Because each of the strings ST is similarly configured, one string ST coupled to the first bit line BL1 is described in detail by way of example.

The string ST includes a source select transistor SST, a plurality of memory cells MC1 to MC16, and a drain select transistor DST that are connected in series to each other between the source line SL and the first bit line BL1. A single string ST may include at least one source select transistor SST and at least one drain select transistor DST, and more memory cells than the memory cells MC1 to MC16 illustrated in the drawing may be included in the string ST.

A source of the source select transistor SST is coupled to the source line SL, and a drain of the drain select transistor DST is coupled to the first bit line BL1. The memory cells MC1 to MC16 are connected in series between the source select transistor SST and the drain select transistor DST. Gates of the source select transistors SST included in different strings ST are coupled to the source select line SSL, gates of the drain select transistors DST included in different strings ST are coupled to the drain select line DSL, and gates of the memory cells MC1 to MC16 are coupled to a different one of the plurality of word lines WL1 to WL16, respectively. A group of memory cells coupled to the same word line, among the memory cells included in different strings ST, may be referred to as a "physical page PPG" or page. The memory block 110 may include a quantity of physical pages PPG identical to the quantity of word lines WL1 to WL16.

At least one dummy memory cell DMC1 is disposed between the source select transistor SST and the memory cell MC1, and at least one dummy memory cell DMC2 is disposed between the drain select transistor DST and the memory cell MC16.

Dummy memory cells (not illustrated) may be disposed between memory cells, for example, MC8 and MC9, disposed in a central region among the plurality of memory cells MC1 to MC16, and the dummy memory cells may be included in a word line group of consecutive memory cells.

One memory cell may store one bit of data. Such a cell is typically designated as a "single-level cell (SLC)". In this example, one physical page PPG stores data corresponding to one logical page LPG. The data corresponding to one logical page LPG may include a number of data bits identical to the number of cells included in one physical page PPG. One memory cell may store two or more bits of data. This cell is typically designated as a "multi-level cell (MLC)". In this example, one physical page PPG stores data corresponding to two or more logical pages LPG.

Figure 4:
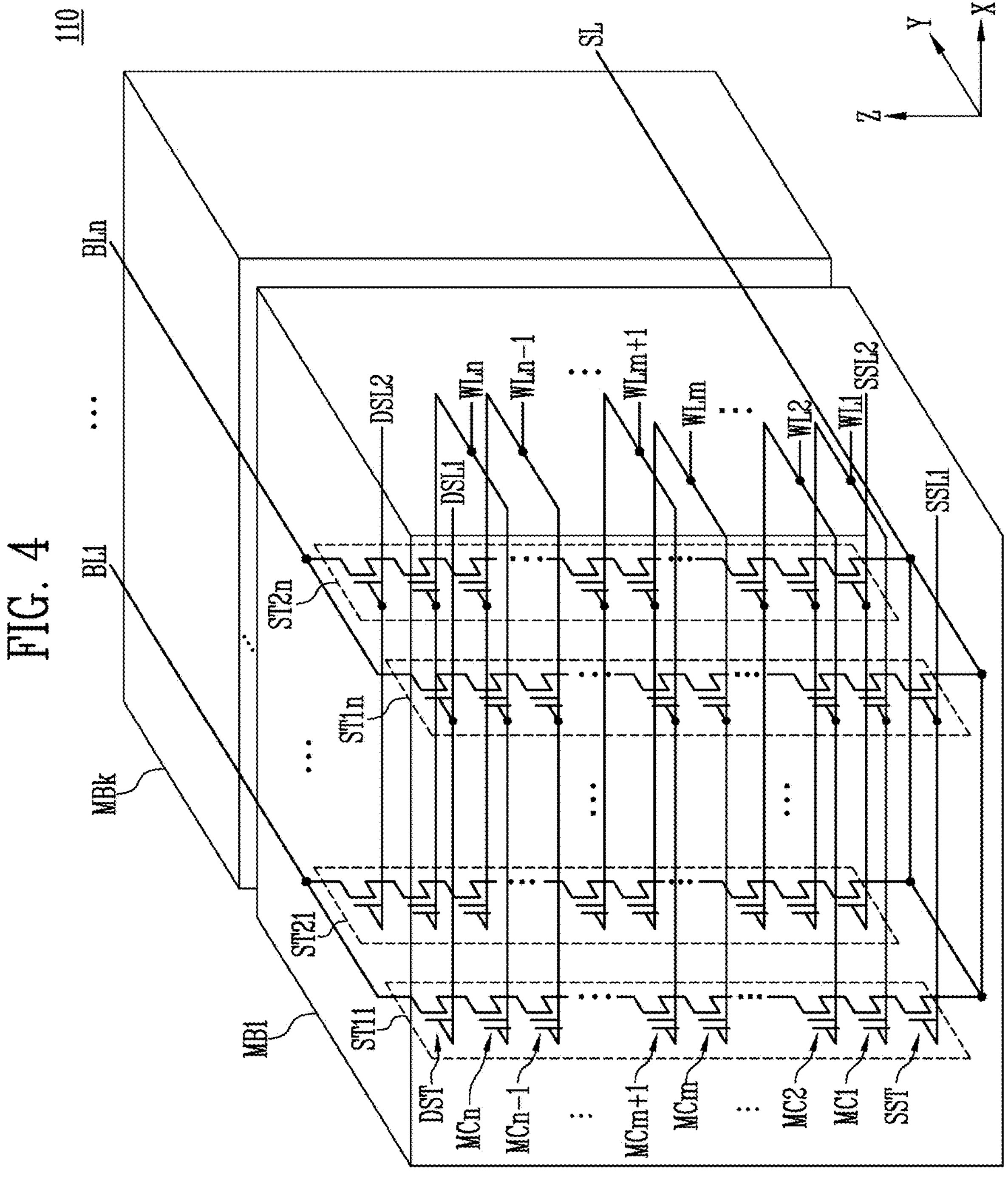
FIG. 4 is a diagram illustrating an embodiment of a memory block having a three-dimensional (3D) structure.

FIG. 4 is a diagram illustrating an embodiment of a memory block having a three-dimensional 3D structure.

Referring to FIG. 4, the memory cell array 100 includes a plurality of memory blocks MB1 to MBk 110. The memory block 110 includes a plurality of strings ST11 to ST1*n* and ST21 to ST2*n*. Each of the plurality of strings ST11 to ST1*n* and ST21 to ST2*n* extends in a vertical direction relative to the orientation of FIG. 4, for example, the Z direction. In the memory block 110, n strings are arranged in a row direction, for example, the X direction). Although two strings are illustrated as arranged in a column direction, for example, the Y direction, this embodiment is provided for convenience of description, and three or more strings may be arranged in the column direction Y direction in other embodiments.

Each of the strings ST11 to ST1*n* and ST21 to ST2*n* includes at least one source select transistor SST, memory cells MC1 to MCn, and at least one drain select transistor DST.

The source select transistor SST of each string is coupled between a source line SL and the memory cells MC1 to MCn. Source select transistors of strings arranged in the same row are coupled to the same source select line. For example, the source select transistors of the strings ST11 to ST**1*n* arranged in a first row are coupled to a first source select line SSL1. The source select transistors of the strings ST21 to ST2*n* arranged in a second row are coupled to a second source select line SSL2. In an embodiment, the source select transistors of the strings ST11 to ST1*n* and ST21 to ST2*n*** are coupled in common to a single source select line.

The memory cells MC1 to MCn in each string are connected in series between the source select transistor SST and the drain select transistor DST. Gates of the memory cells MC1 to MCn are coupled to the word lines WL1 to WLn, respectively.

In an embodiment, at least one of the memory cells MC1 to MCn is used as a dummy memory cell. When the dummy memory cell is provided, the voltage or current of the corresponding string is stably controlled.

The drain select transistor DST of each string is coupled between the corresponding bit line and the memory cells MC1 to MCn. The drain select transistors DST of strings arranged in the row direction are coupled to a drain select line extending in the row direction. For example, the drain select transistors DST of the strings ST11 to ST**1*n* in the first row are coupled to a first drain select line DSL1. The drain select transistors DST of the strings ST21 to ST2*n* in the second row are coupled to a second drain select line DSL2** in another example.

The plurality of memory blocks MB1 to MBk 110 described in FIG. 4 may share the source line SL.

Figure 5:
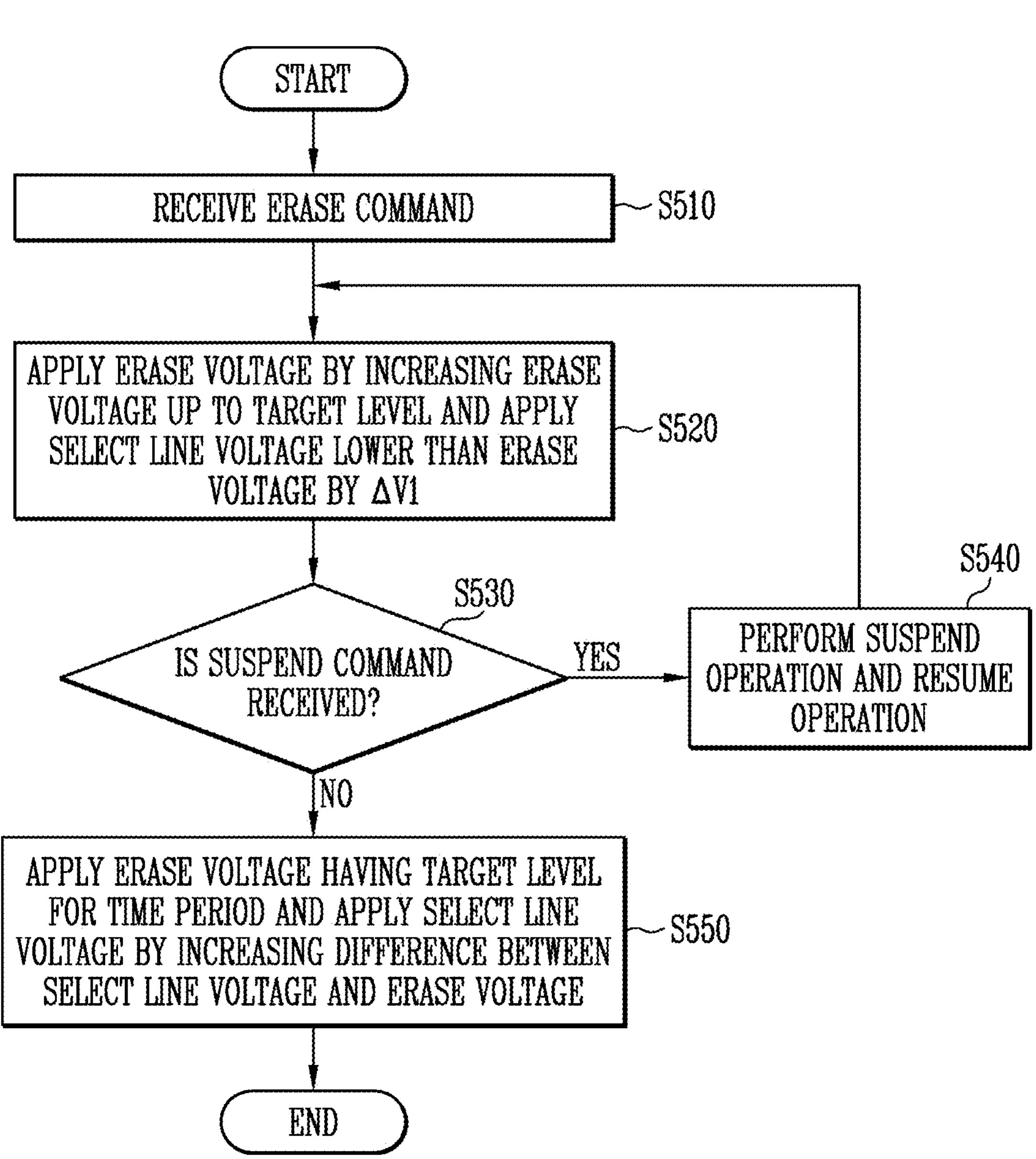
FIG. 5 is a flowchart illustrating a method of operating a memory device according to an embodiment of the present disclosure.

FIG. 5 is a flowchart illustrating a method of operating a memory device according to an embodiment of the present disclosure.

Figure 6:
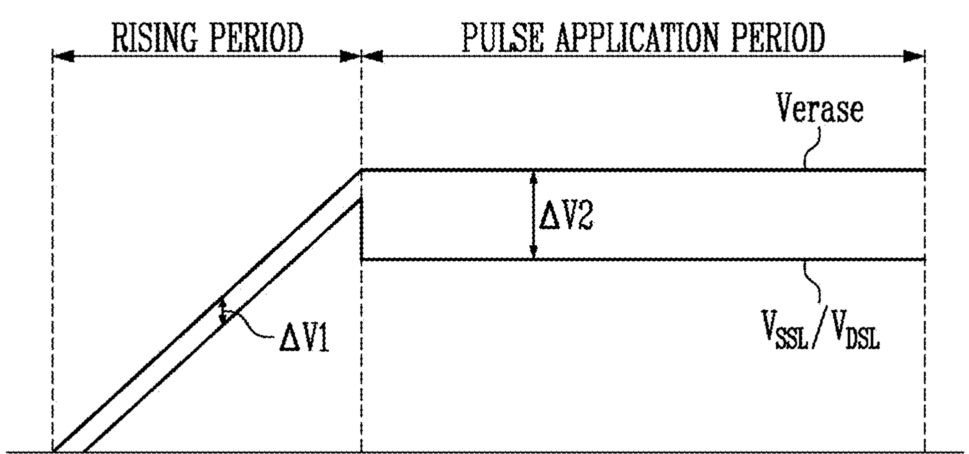
FIG. 6 and FIG. 7 are timing diagrams illustrating an erase voltage and a select line voltage during an erase operation of a memory device according to an embodiment of the present disclosure.
Figure 7:
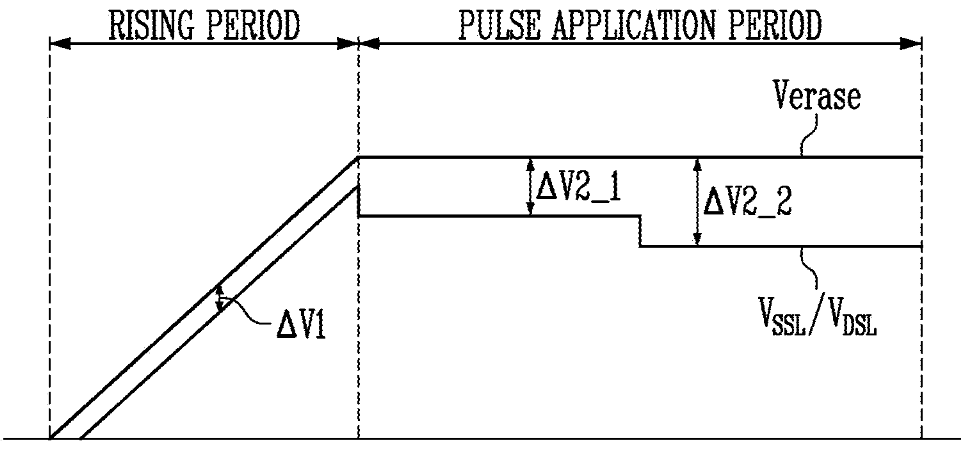

FIG. 6 and FIG. 7 are timing diagrams illustrating an erase voltage and a select line voltage during an erase operation of a memory device according to an embodiment of the present disclosure.

The method of operating the memory device according to an embodiment of the present disclosure is described with reference to FIG. 1 to FIG. 7.

The memory device 1100 receives S510 a command CMD corresponding to an erase operation from the memory controller 1200, also referred to as an erase command. The control logic 300 of the memory device 1100 controls the peripheral circuits 200 to perform an erase operation in response to the received command CMD.

An erase voltage Verase is increased up to a target voltage level, and the increased erase voltage is applied S520. For example, the source line driver 270 generates the erase voltage Verase, which linearly increases from 0 V to the target voltage level, and applies the erase voltage Verase to the source line SL in response to a source line control signal CTRL_SL during the rising period of the erase operation. The page buffers PB1 to PBn 231 apply the erase voltage Verase, which linearly increases from 0 V to the target voltage level, to the bit lines BL1 to BLn during the rising period of the erase operation. The erase voltage Verase, which linearly increases from 0 V to the target voltage level, may increase with a constant slope.

The voltage generating circuit 210 generates S520 operating voltages that are applied to the source select line SSL and the drain select line DSL of a selected memory block in response to an operation signal OP_CMD. The voltage generating circuit 210 generates a select line voltage by adjusting the voltage potential of the select line voltage under control of the operating voltage controller 310 of the control logic 300. For example, as shown in FIG. 6 or FIG. 7, the select line voltage $V_{SSL}/V_{DSL}$ applied to the source select line SSL or the drain select line DSL of the selected memory block is generated at a voltage lower than the erase voltage Verase by a first voltage differential ΔV1. The row decoder 220 applies the select line voltages $V_{SSL}$ and $V_{DSL}$ to the source select line SSL and the drain select line DSL of the selected memory block in response to row decoder control signals AD_signals. Each of the select line voltages $V_{SSL}$ and $V_{DSL}$ may be a voltage that increases with a constant slope from 0 V.

The slope of the erase voltage Verase may increase at a similar rate as the rate of increase of the slope of the select line voltages $V_{SSL}$ and $V_{DSL}$.

A determination is made S530 whether a suspend command is received during the rising period.

For example, the memory controller 1200 generates and outputs a suspend command to suspend the erase operation of the memory device 1100. The control logic 300 of the memory device 1100 continues to perform the erase operation or performs a suspend operation including suspending the erase operation currently being performed based on whether the suspend command is received. The control logic 300 determines whether the suspend command is received during the rising period of the erase operation.

When the suspend command is received during the rising period (YES in S530), the control logic 300 controls the peripheral circuits 200 to suspend the erase operation currently being performed in response to the received suspend command and to perform S540 a general operation such as a program operation or a read operation. After the general operation is completed, the control logic 300 controls the peripheral circuits 200 to perform a resume operation including resuming the suspended erase operation. When the erase operation is re-performed from the beginning of the rising period, the re-performing procedure starts at S520.

When a suspend command is not received during the rising period (NO in S530), the erase operation continues to be performed S550. For example, during a pulse application period after the rising period, the erase voltage Verase at the target voltage level is applied to the source line SL or the bit lines BL1 to BLn for a predetermined time period for the pulse application period, such as a predetermined time period based on the amount of data to be erased.

The voltage generating circuit 210 generates S550 a select line voltage by adjusting the voltage potential of the select line voltage under control of the operating voltage controller 310 of the control logic 300. For example, as illustrated in FIG. 6, the select line voltage $V_{SSL}/V_{DSL}$ applied to the source select line SSL or the drain select line DSL of the selected memory block is generated at a voltage lower than the erase voltage Verase by a second voltage differential ΔV2. The second voltage differential ΔV2 is greater or larger than the first voltage differential ΔV1. In an embodiment, as illustrated in FIG. 7, the select line voltage $V_{SSL}/V_{DSL}$ that is applied to the source select line SSL or the drain select line DSL of the selected memory block, has a voltage lower than the erase voltage Verase by a second voltage differential ΔV2_1, and the voltage potential of the select line voltage $V_{SSL}/V_{DSL}$ may be decreased stepwise over time. For example, the difference between the select line voltage $V_{SSL}/V_{DSL}$ and the erase voltage Verase gradually increases. For example, during a first period, the potential of the select line voltage $V_{SSL}/V_{DSL}$ is lower than the erase voltage Verase by the second voltage differential ΔV2_1. During a second period following the first period, the potential of the select line voltage $V_{SSL}/V_{DSL}$ is lower than the erase voltage Verase by a second voltage differential ΔV2_2. The second voltage differentials ΔV2_1 and ΔV2_2 are greater or larger than the first voltage differential ΔV1.

As described, during the rising period, a difference between the erase voltage Verase that is applied to the source line SL or the bit lines BL1 to BLn and the select line voltage $V_{SSL}/V_{DSL}$ that is applied to the drain select line DSL or the source select line SSL is maintained at first voltage differential ΔV1. Even though the voltage difference between the erase voltage Verase and the select line voltage $V_{SSL}/V_{DSL}$ is relatively small, and a suspend command is received multiple times to repeatedly increase and apply voltages S520 during the rising period, the decrease in the threshold voltage of the drain select transistor DST or the source select transistor SST is suppressed.

During the pulse application period, the voltage difference between the erase voltage Verase and the select line voltage $V_{SSL}/V_{DSL}$ applied to the drain select line DSL or the source select line SSL is maintained at a voltage differential ΔV2 or greater. Accordingly, a gate induced drain leakage (GIDL) current from a lower channel of the drain select transistor DST or the source select transistor SST may be sufficiently generated, and erase operation characteristics may be improved.

Figure 8:
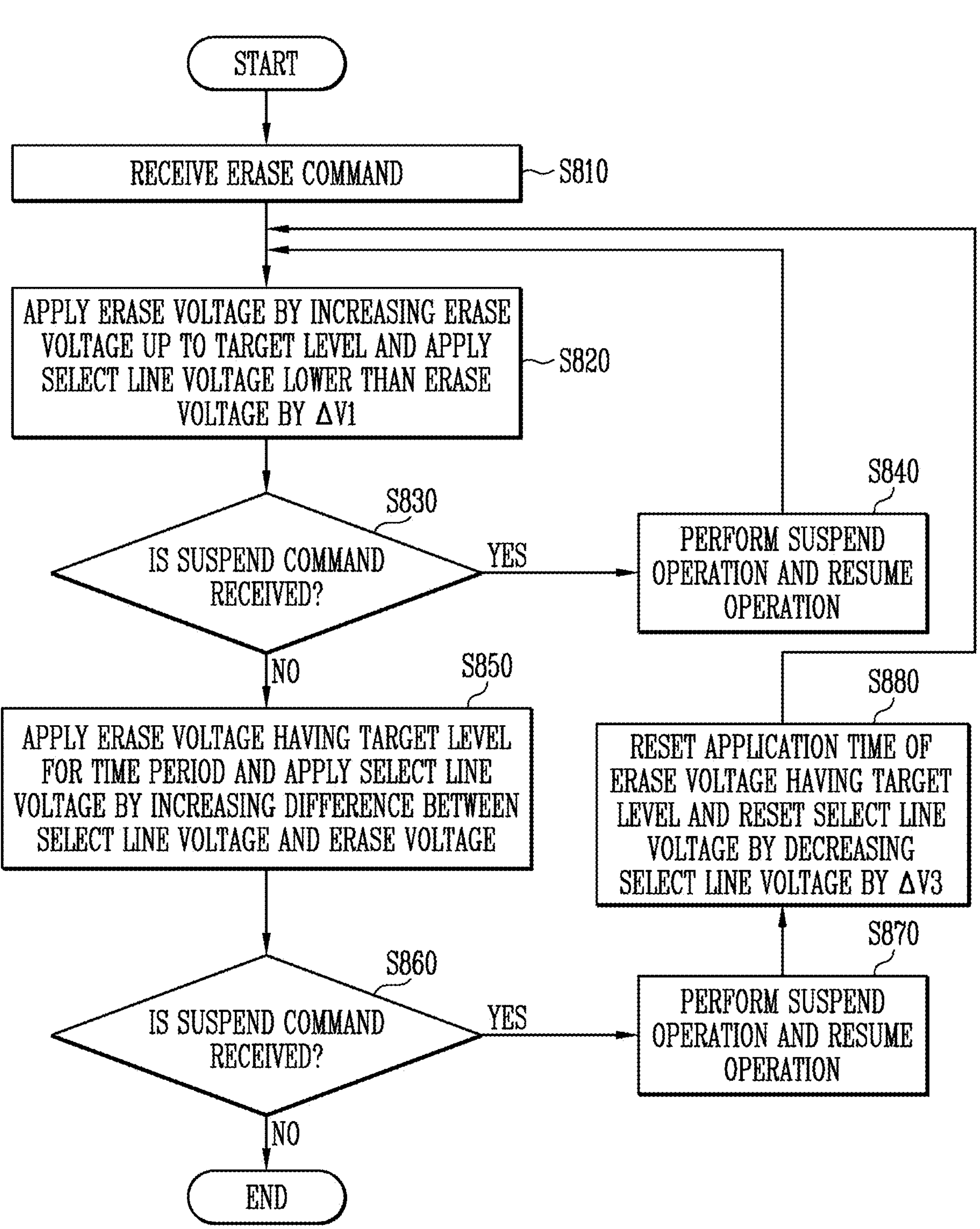
FIG. 8 is a flowchart illustrating a method of operating a memory device according to an embodiment of the present disclosure.

FIG. 8 is a flowchart illustrating a method of operating a memory device according to an embodiment of the present disclosure.

Figure 9:
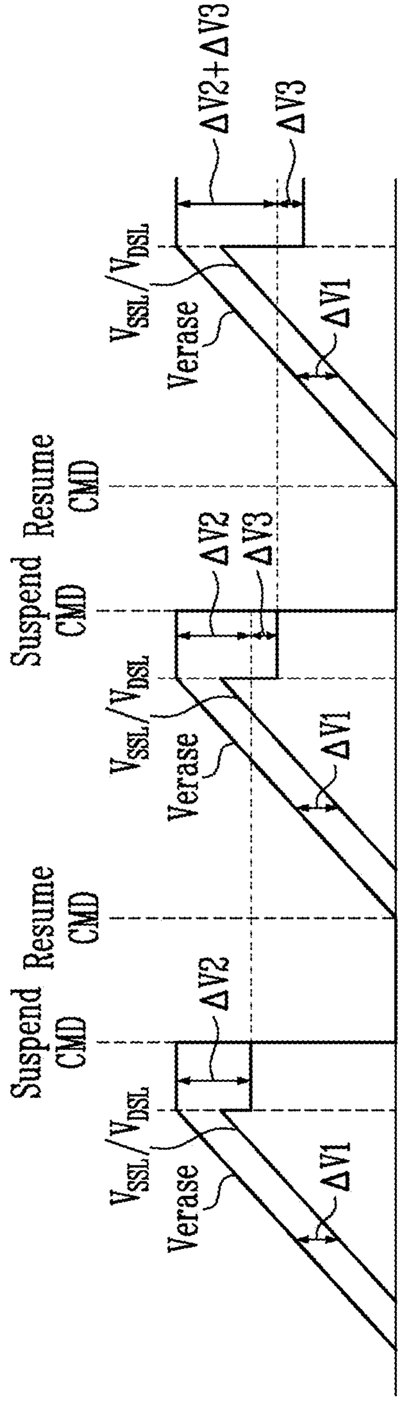
FIG. 9 is a timing diagram illustrating an erase voltage and a select line voltage during an erase operation of a memory device according to an embodiment of the present disclosure.

FIG. 9 is a timing diagram illustrating an erase voltage and a select line voltage during an erase operation of a memory device according to an embodiment of the present disclosure.

The method of operating the memory device according to an embodiment of the present disclosure is described with reference to FIG. 1 to FIG. 4, FIG. 8 and FIG. 9.

The memory device 1100 receives S810 a command CMD corresponding to an erase operation from the memory controller 1200, also referred to as an erase command. The control logic 300 of the memory device 1100 controls the peripheral circuits 200 to perform an erase operation in response to the received command CMD.

An erase voltage Verase is increased up to a target voltage level, and the increased erase voltage is applied S820. For example, the source line driver 270 generates the erase voltage Verase, which linearly increases from 0 V to the target voltage level, and applies the erase voltage Verase to the source line SL in response to a source line control signal CTRL_SL during the rising period of the erase operation. The page buffers PB1 to PBn 231 apply the erase voltage Verase, which linearly increases from 0 V to the target voltage level, to the bit lines BL1 to BLn during the rising period of the erase operation. The erase voltage Verase, which linearly increases from 0 V to the target voltage level, may increase with a constant slope.

The voltage generating circuit 210 generates S820 operating voltages that are applied to the source select line SSL and the drain select line DSL of a selected memory block in response to an operation signal OP_CMD. The voltage generating circuit 210 generates a select line voltage by adjusting the voltage potential of the select line voltage under control of the operating voltage controller 310 of the control logic 300. For example, as shown in FIG. 6, FIG. 7, or FIG. 9, the select line voltage $V_{SSL}/V_{DSL}$ applied to the source select line SSL or the drain select line DSL of the selected memory block is generated at a voltage lower than the erase voltage Verase by a first voltage differential ΔV1.

The row decoder 220 applies the select line voltages $V_{SSL}$ and $V_{DSL}$ to the source select line SSL and the drain select line DSL of the selected memory block in response to row decoder control signals AD_signals. Each of the select line voltages $V_{SSL}$ and $V_{DSL}$ may be a voltage that increases with a constant slope from 0 V.

The slope of the erase voltage Verase may increase at a similar rate as the rate of increase of the slope of the select line voltages $V_{SSL}$ and $V_{DSL}$.

A determination is made S830 whether a suspend command is received during the rising period.

For example, the memory controller 1200 generates and outputs a suspend command to suspend the erase operation of the memory device 1100. The control logic 300 of the memory device 1100 continues to perform the erase operation or performs a suspend operation including suspending the erase operation currently being performed based on whether the suspend command is received.

When the suspend command is received during the rising period (YES in S830), the control logic 300 controls the peripheral circuits 200 to suspend the erase operation currently being performed in response to the received suspend command and to perform S840 a general operation such as a program operation or a read operation. After the general operation is completed, the control logic 300 controls the peripheral circuits 200 to perform a resume operation including resuming the suspended erase operation in response to the resume command. The resume command is received from the memory controller 1200. When the erase operation is re-performed from the beginning of the rising period, the re-performing procedure starts at S820.

When a suspend command is not received during the rising period (NO in S830), the erase operation continues to be performed S850. For example, during a pulse application period after the rising period, the erase voltage Verase at the target voltage level is applied to the source line SL or the bit lines BL1 to BLn for a time period.

The voltage generating circuit 210 generates a select line voltage by adjusting the voltage potential of the select line voltage under control of the operating voltage controller 310 of the control logic 300. For example, as illustrated in FIG. 9, the select line voltage $V_{SSL}/V_{DSL}$ applied to the source select line SSL or the drain select line DSL of the selected memory block may be generated at a voltage lower than the erase voltage Verase by a second voltage differential ΔV2. The second voltage differential ΔV2 is greater or larger than the first voltage differential ΔV1.

A determination is made S860 whether a suspend command is received during the pulse application period.

For example, the memory controller 1200 generates and output a suspend command to suspend the erase operation of the memory device 1100. The control logic 300 of the memory device 1100 continues to perform the erase operation or performs a suspend operation including suspending the erase operation currently being performed based on whether the suspend command is received. The control logic 300 determines whether the suspend command is received during the pulse application period of the erase operation.

When the suspend command is received during the pulse application period (YES in S860), the control logic 300 controls the peripheral circuits 200 to suspend the erase operation currently being performed in response to the received suspend command and to perform S870 a general operation such as a program operation or a read operation. After the general operation is completed, the control logic 300 controls the peripheral circuits 200 to perform a resume operation including resuming the suspended erase operation in response to the resume command. The resume command is received from the memory controller 1200.

When the suspend command is received S880 during the pulse application period, the control logic 300 checks, determines, or identifies a previous pulse application period during which the erase voltage Verase was applied prior to receiving the suspend command, calculates the remaining application time period of the pulse application period, referred to as a resumed pulse application period, to perform the resume operation by subtracting the time period for previous pulse application period during which the erase voltage Verase was last applied, for example, utilizing the time at which the erase operation was suspended or interrupted, from the predetermined time period for the pulse application period, and resets the application time to apply the erase voltage Verase to the remaining application time period or the resumed pulse application period.

The operating voltage controller 310 resets the voltage potential of the select line voltage during the erase operation that is re-performed during the resume operation. For example, the operating voltage controller 310 resets the select line voltage used during the pulse application period executed before the suspend operation by decreasing the potential of the select line voltage by a third voltage differential ΔV3, and the procedure continues at S820.

The voltage generating circuit 210 generates the select line voltage by adjusting the voltage potential of the select line voltage under control of the operating voltage controller 310 of the control logic 300. For example, as illustrated in FIG. 9, the select line voltage $V_{SSL}/V_{DSL}$ applied to the source select line SSL or the drain select line DSL of the selected memory block is generated at a voltage lower than the erase voltage Verase by the second voltage differential ΔV2. The second voltage differential ΔV2 is greater or larger than the first voltage differential ΔV1.

After the general operation is completed, the control logic 300 controls the peripheral circuits 200 to perform a resume operation including resuming the suspended erase operation. When the erase operation is re-performed from the beginning of the rising period, the re-performing procedure starts at S820.

When a suspend command is not received during the pulse application period (NO in S860), the control logic 300 applies the erase voltage Verase to the source line SL or the bit lines BL1 to BLn for the pulse application period and terminates the erase operation.

As described, during the rising period, a voltage difference between the erase voltage Verase that is applied to the source line SL or the bit lines BL1 to BLn and the select line voltage $V_{SSL}/V_{DSL}$ that is applied to the drain select line DSL or the source select line SSL is maintained at a first voltage differential ΔV1. Even though the voltage difference between the erase voltage Verase and the select line voltage $V_{SSL}/V_{DSL}$ is relatively small, and a suspend command is received multiple times to repeatedly increase and apply voltages S820 during the rising period, the decrease in the threshold voltage of the drain select transistor DST or the source select transistor SST is suppressed.

During the pulse application period, the voltage difference between the erase voltage Verase and the select line voltage $V_{SSL}/V_{DSL}$ applied to the drain select line DSL or the source select line SSL is maintained at a voltage differential ΔV2 or greater. Accordingly, a gate induced drain leakage (GIDL) current from a lower channel of the drain select transistor DST or the source select transistor SST may be sufficiently generated, and erase operation characteristics may be improved.

When the suspend command is received during the pulse application period, more gate induced drain leakage (GIDL) current may be controlled to be generated during the re-executed pulse application period by setting the potential of the select line voltage $V_{SSL}/V_{DSL}$ applied to the drain select line DSL or the source select line SSL to a value lower than the voltage potential used in a previous pulse application period.

Figure 10:
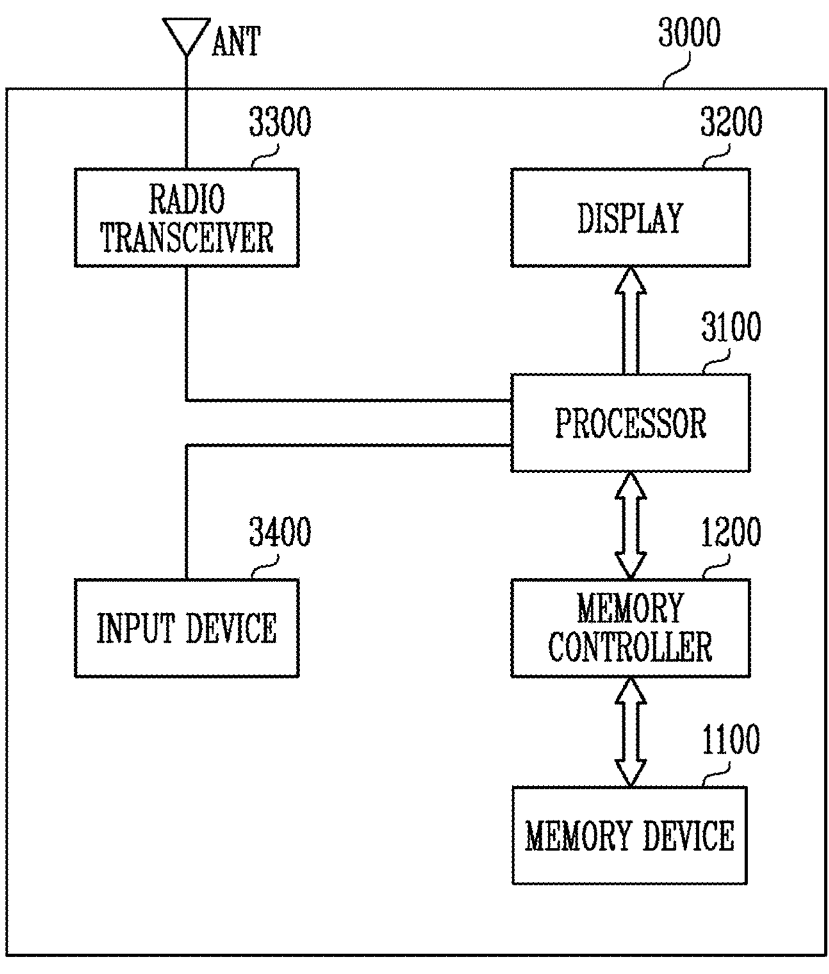
FIG. 10 is a diagram illustrating an embodiment of a memory system including the memory device.

FIG. 10 is a diagram illustrating an embodiment of a memory system including the memory device, for example, as shown in of FIG. 2.

Referring to FIG. 10, a memory system 3000 may be a cellular phone, a smartphone, a tablet PC, a personal digital assistant (PDA), a wireless communication device, and so forth. The memory system 3000 includes a memory device 1100 and a memory controller 1200 that is capable of controlling the operation of the memory device 1100. The memory controller 1200 controls a data access operation of the memory device 1100, for example, a program operation, an erase operation, and a read operation, under the control of a processor 3100. For example, the memory controller 1200 controls the memory device 1100 to perform an erase operation, to suspend the erase operation in response to a suspend command, and to perform a resume operation in response to a resume command. When the suspend command is received during a pulse application period of the erase operation, the select line voltage used during a resumed pulse application period for the resumed erase operation is adjusted by decreasing the select line voltage during the resume operation.

Data programmed into the memory device 1100 may be output via a display 3200 under the control of the memory controller 1200.

A radio transceiver 3300 exchanges or communicates radio signals through an antenna ANT. For example, the radio transceiver 3300 converts radio signals received through the antenna ANT into signals processed by the processor 3100. The processor 3100 processes the signals from the radio transceiver 3300 and transfers the processed signals, for example, to the memory controller 1200 or the display 3200. The memory controller 1200 may provide the signals processed by the processor 3100 to the memory device 1100. The radio transceiver 3300 converts signals output from the processor 3100 into radio signals and transmits the radio signals to an external device through the antenna ANT. An input device 3400 is a device used to input a control signal that controls the operation of the processor 3100 or data to be processed by the processor 3100 and may be, for example, a pointing device such as a touch pad or a computer mouse, a keypad, a keyboard, and so forth. The processor 3100 controls the operation of the display 3200 such that data output from the memory controller 1200, data output from the radio transceiver 3300, and data output from the input device 3400 are output via the display 3200.

In accordance with an embodiment, the memory controller 1200 capable of controlling the operation of the memory device 1100 may be part of the processor 3100 or an integrated circuit chip separate from the processor 3100.

Figure 11:
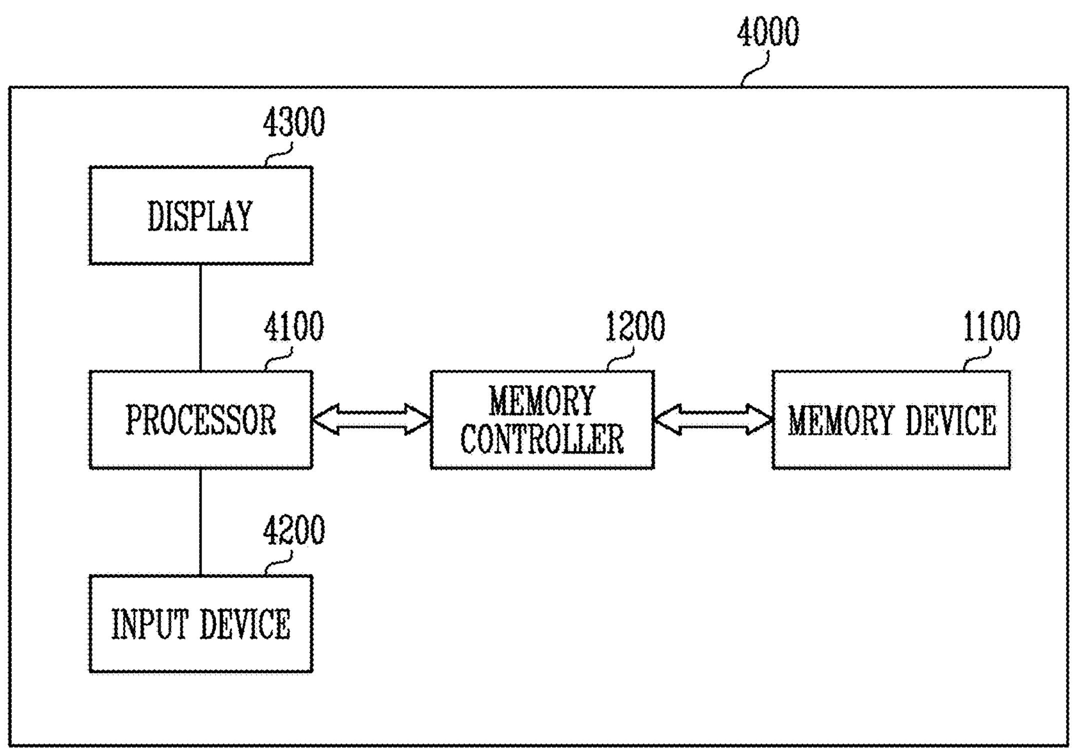
FIG. 11 is a diagram illustrating an embodiment of a memory system including the memory device.

FIG. 11 is a diagram illustrating an embodiment of a memory system including the memory device, for example, as shown in FIG. 2.

Referring to FIG. 11, a memory system 4000 may be a personal computer (PC), a tablet PC, a net-book, an e-reader, a personal digital assistant (PDA), a portable multimedia player (PMP), an MP3 player, an MP4 player, and so forth.

The memory system 4000 includes a memory device 1100 and a memory controller 1200 capable of controlling the data processing operation of the memory device 1100. For example, the memory controller 1200 controls the memory device 1100 to perform an erase operation, to suspend the erase operation in response to a suspend command, and to perform a resume operation in response to a resume command. When the suspend command is received during a pulse application period of the erase operation, the select line voltage used during a resumed pulse application period for the resumed erase operation is adjusted by decreasing the select line voltage during the resume operation.

A processor 4100 outputs data stored in the memory device 1100 via a display 4300 according to data input from an input device 4200. For example, the input device 4200 may be a pointing device such as a touch pad or a computer mouse, a keypad, a keyboard, and so forth.

The processor 4100 controls the overall operation of the memory system 4000 and controls the operation of the memory controller 1200. The memory controller 1200 capable of controlling the operation of the memory device 1100 may be part of the processor 4100 or an integrated circuit chip separate from the processor 4100.

Figure 12:
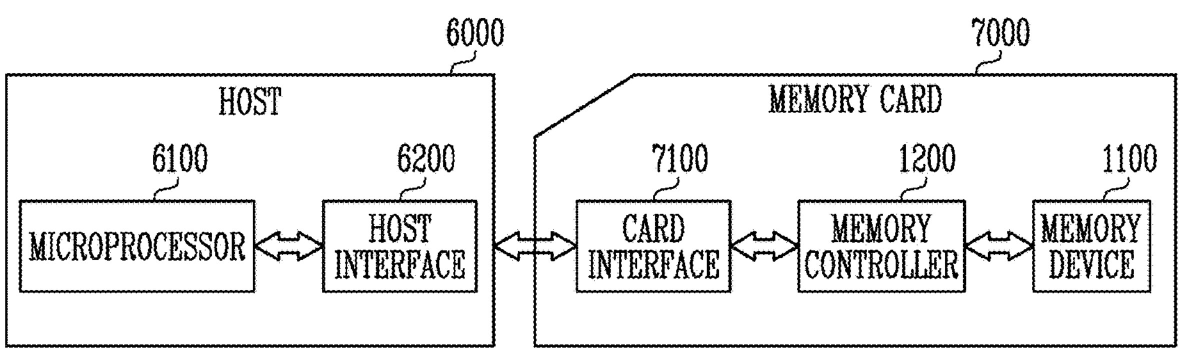
FIG. 12 is a diagram illustrating an embodiment of a memory system including the memory device.

FIG. 12 is a diagram illustrating an embodiment of a memory system including the memory device, for example, as shown in FIG. 2.

Referring to FIG. 12, a memory system 7000 may be a memory card or a smart card. The memory system 7000 includes a memory device 1100, a memory controller 1200, and a card interface 7100.

The memory controller 1200 controls data exchange between the memory device 1100 and the card interface 7100. For example, the memory controller 1200 controls the memory device 1100 to perform an erase operation, to suspend the erase operation in response to a suspend command, and to perform a resume operation in response to a resume command. When the suspend command is received during a pulse application period of the erase operation, the select line voltage used during a resumed pulse application period for the resumed erase operation is adjusted by decreasing the select line voltage during the resume operation. The card interface 7100 may be, but is not limited to, a secure digital (SD) card interface or a multimedia card (MMC) interface.

The card interface 7100 provides an interface for data exchange between a host 6000 and the memory controller 1200 according to a protocol of the host 6000. The card interface 7100 may support a universal serial bus (USB) protocol, an interchip (IC)-USB protocol, and so forth. In this example, the card interface may refer to hardware capable of supporting a protocol used by the host 6000, software installed in the hardware, and/or a signal transmission method.

When the memory system 7000 is coupled to a host interface 6200 of the host 6000 such as a PC, a tablet PC, a digital camera, a digital audio player, a cellular phone, console video game hardware, a digital set-top box, and so forth, the host interface 6200 performs data communication with the memory device 1100 through the card interface 7100 and the memory controller 1200 under the control of a microprocessor 6100.

According to the present disclosure, threshold voltage distributions of select transistors may be improved by adjusting a potential difference between an operating voltage and an erase voltage that are applied to the select transistors even when a suspend operation is repeated multiple times during an erase operation of a memory device.

What is claimed is:

1. A memory device comprising:

a memory block including a plurality of memory cells;

a source line driver configured to apply an erase voltage to a source line of the memory block during an erase operation;

a page buffer group configured to apply the erase voltage to bit lines of the memory block during the erase operation;

a voltage generating circuit configured to generate a select line voltage that is applied to a select line of the memory block during the erase operation; and control logic configured to control the source line driver, the page buffer group, and the voltage generating circuit to perform a suspend operation including suspending the erase operation in response to a suspend command;

wherein the control logic is configured to control the voltage generating circuit such that, during a rising period of the erase operation in which the erase voltage increases to a target voltage level, a difference between the erase voltage and the select line voltage is maintained at a first voltage differential, and during a pulse application period during which the erase voltage at the target voltage level is applied, the difference between the erase voltage and the select line voltage is maintained at a second voltage differential that is greater than the first voltage differential.

2. The memory device according to claim 1, wherein:

the control logic comprises an operating voltage controller, and the operating voltage controller is configured to control the voltage generating circuit to set a voltage level of the select line voltage and generate the select line voltage at the voltage level.

3. The memory device according to claim 1, wherein, during the rising period, the erase voltage and the select line voltage each increase with a constant slope.

4. The memory device according to claim 1, wherein the select line voltage is maintained at a constant level or decreases stepwise over time during the pulse application period.

5. The memory device according to claim 1, wherein the control logic is configured to control the source line driver, the page buffer group, and the voltage generating circuit such that, in response to receiving the suspend command during the rising period, the erase operation is suspended and a program operation or a read operation is performed.

6. The memory device according to claim 5, wherein the control logic is configured to control the source line driver, the page buffer group, and the voltage generating circuit such that, after the program operation or read operation is completed, the suspended erase operation is resumed by beginning a second rising period.

7. A method of operating a memory device, the method comprising:

applying, to a source line or a bit line of a memory block, an erase voltage that increases to a target voltage level during a rising period of an erase operation;

applying, to a select line of the memory block, a select line voltage that is lower than the erase voltage by a first voltage differential during the rising period;

in response to receiving a suspend command during the rising period, suspending the erase operation and resuming the erase operation in response to receiving a resume command;

after the rising period ends, applying the erase voltage at the target voltage level during a pulse application period of the erase operation; and applying the select line voltage that is lower than the erase voltage by a second voltage differential during the pulse application period, wherein the second voltage differential is greater than the first voltage differential.

8. The method according to claim 7, wherein the select line voltage decreases stepwise over time during the pulse application period.

9. The method according to claim 7, wherein, during the rising period, the erase voltage and the select line voltage each increase with a constant slope.

10. The method according to claim 7, further comprising suspending the erase operation and performing a program operation or a read operation.

11. The method according to claim 7, wherein resuming the erase operation comprises by beginning a second rising period.

* * * * *